(12) United States Patent
Cole et al.

(10) Patent No.: US 6,287,940 B1
(45) Date of Patent: Sep. 11, 2001

(54) DUAL WAFER ATTACHMENT PROCESS

(75) Inventors: Barrett E. Cole, Bloomington; Robert E. Higashi, Shorewood; Jeffrey A. Ridley, Burnsville, all of MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/365,703

(22) Filed: Aug. 2, 1999

(51) Int. Cl.$^7$ ................................................ H01L 21/46
(52) U.S. Cl. ...................... 438/455; 438/458; 438/107; 438/118
(58) Field of Search .................................. 438/455, 458, 438/107, 108, 109, 118

(56) References Cited

U.S. PATENT DOCUMENTS

| | | |
|---|---|---|
| 5,173,474 | 12/1992 | Connell et al. . |
| 5,246,880 | 9/1993 | Reele et al. . |
| 5,449,659 | 9/1995 | Garrison et al. . |
| 5,455,445 | 10/1995 | Kurtz et al. . |
| 5,465,009 | 11/1995 | Drabik et al. . |
| 5,489,554 | * 2/1996 | Gates . |
| 5,572,060 | 11/1996 | Butler et al. . |
| 5,574,298 | 11/1996 | Hashimoto et al. . |
| 5,627,106 | 5/1997 | Hsu . |
| 5,627,112 | 5/1997 | Tennant et al. . |
| 5,880,010 | * 3/1999 | Davidson ............................ 438/455 |
| 5,976,953 | * 11/1999 | Zavracky et al. .................... 438/455 |

OTHER PUBLICATIONS

Cole B et al: "Monolithic Two–Dimensional Arrays of Micromachined Microstructures for Infrared Applications" Proceedings of the IEEE, US, IEEE. New York. vol. 86, No. 8, Aug. 1998 (1998–08), pp. 1679–1686, XP000848433, ISSN: 0018–9219, The Whole Document.

Patent Abstracts of Japan, vol. 1999, No. 2, Feb. 26, 1999 & JP 10 303434 A (Murata MFG Co Ltd), Nov. 13, 1998 Abstract.

* cited by examiner

*Primary Examiner*—Trung Dang
(74) *Attorney, Agent, or Firm*—John G. Shudy, Jr.

(57) ABSTRACT

Producing the microstructures on separate substrates, which are bonded. One of these structures may be temperature sensitive CMOS electronics. There may be a high-temperature thermal sensor on one wafer and low-temperature CMOS electronics. In the case where the bonding material is polyimide, the polyimide on both surfaces to be bonded is soft baked. The wafers are placed in a wafer bonder and, using precision alignment, brought into contact. The application of pressure and heat forms a bond between the two coatings of polyimide. A wafer may need to be removed from a combined structure. One of the bonded structures may be placed on a sacrificial layer that can be etched away to facilitate removal of a wafer without grinding. After wafer removal, a contact from the backside of one of the structures now on polyimide to the other on the wafer may be made. Sacrificial material, for example, polyimide, may be removed from between the structures that are connected via a contact. A microstructure may be bonded with something that is not a microstructure, such as single-or multi-layer material, crystalline or amorphous.

17 Claims, 23 Drawing Sheets

DUAL WAFER ATTACHMENT PROCESS

BACKGROUND

The Government may have rights in this invention pursuant to Contract No. N00014-96-C-2906, awarded by the Department of the Navy.

The invention pertains to microstructure wafers. Particularly, it pertains to attachment of wafers, and more particularly to temperature sensitive wafers.

The invention involves the bonding of devices or materials fabricated on separate wafers. A microstructure's front surface may be bonded to another microstructure; however, a microstructure on one substrate may be incompatible with the process used to produce the other microstructure. The invention is designed to avoid problems caused by such incompatibility.

The need for such a process is driven by the performance needs in several areas of military and industrial applications, including thermal and mechanical sensors, magnetoresistive memory arrays, and superconducting channels.

Wafer bonding technology has existed for some time. Therefore, other patented processes exist producing more and less similar structures. The idea of bonding wafers processed with incompatible processes has been tried. Existing bolometer technology requires that the readout electronics, CMOS and metalizations survive the processing conditions used for the detector materials. The development of high temperature coefficient of resistance (TCR) materials, which require very high processing temperature, provided an incentive to develop a technique for coupling these materials into bolometer technology. The present technique is superior to related art single-wafer technology because the detector film is processed at temperatures much higher than 450 degrees Celsius (C.), which is the practical limit of CMOS devices.

SUMMARY OF THE INVENTION

The present invention consists of producing the desired microstructures on separate substrates and coating them with a suitable bonding material. These structures may be CMOS electronics or a pure microstructure. One embodiment includes a high-temperature thermal sensor on one wafer and low-temperature CMOS electronics with some electrical and thermal features on another wafer. In the case where the bonding material is polyimide, the polyimide on both surfaces to be bonded are soft baked. The wafers are placed in a wafer bonder and, using precision alignment, brought into contact. The application of pressure and heat forms a bond between the two coatings of polyimide.

A wafer may need to be removed from a combined structure. A particularly advantageous technique is to build one of the bonded structures on a sacrificial layer that can be etched away to facilitate removal of a wafer without grinding. Further processing can be done on either or both structures.

After wafer removal, a contact from the backside of one of the structures now on polyimide to the other on the wafer has been demonstrated. This contact, electrical or physical, is one of many kinds, which could be made. Sacrificial material, for example, polyimide, may be removed from between the structures that are bonded via a contact. It may also be desirable to bond a microstructure with something that is not a microstructure, such as single- or multi-layer material, crystalline or amorphous. The present process provides a good method of bonding of these items, while incorporating the materials having a temperature coefficient of resistance that range from a typical value of 2%/C to a high value of 3.5%/C on the present wafers. The TCR may be measured at a value of 12%/C on bulk substrates with much lower $1/f$ ($k=10^{-14}$) noise than $VO_x$ (vanadium oxide) ($k=10^{-13}$) films. The material may be thinned after wafer removal to improve performance with lower mass.

DESCRIPTION OF THE EMBODIMENTS

The dual wafer microstructure attachment process (DWaMA Process) is described in the context of fabricating a bolometer. The process, in this context and in general, is partitioned into three phases of fabrication.

The first phase is to create a microstructure for thermal sensing. A high temperature coefficient of resistance (TCR) film is necessary for high performance microstructures, requiring high temperature processing. The microstructure will be formed on a first, temporary wafer on which a release layer will first be deposited. These steps are illustrated in FIGS. 1–6 for one device of many on a given wafer.

Figure 1:
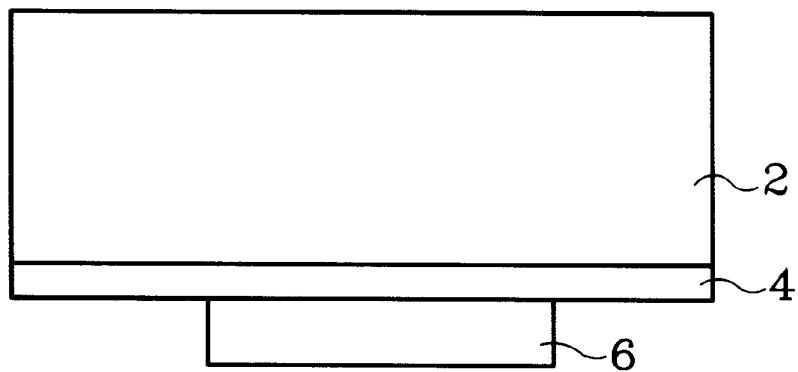
FIGS. 1–6 are cross-sectional views of a high-temperature thermal sensor being formed on a silicon wafer.

In FIG. 1, a silicon wafer 2 of a suitable quality is obtained and prepared to be used as a substrate for a thermal sensing microstructure. A layer 4 of hastalloy is first deposited across the surface of wafer 2. This material is compatible with the processes required to form the sensor, though it is not part of it, and can be etched by a method with good selectivity properties against the materials to be in contact with it, excluding the wafer. It also provides a suitable surface on which to form the sensor. Any material used for this sacrificial layer should have these three properties. A yttria stabilized zirconia (YSZ) crystal orientation film 6, appropriate for the application, is then deposited across the surface of hastalloy layer 4 and patterned, leaving a mesa 6, per this particular sensor's design. Since this wafer's front surface will be bonded with another's front surface, the sensor is actually being constructed from the top down. This property of the proposed method can be considered when designing according to this methodology. Present wafer 2 is designed according to the mirroring effect, which takes place when bonding wafers face-to-face.

Figure 2:
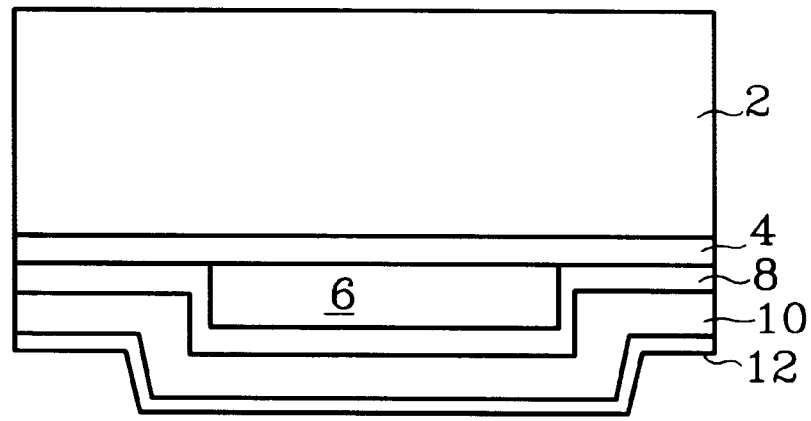
Figure 3:
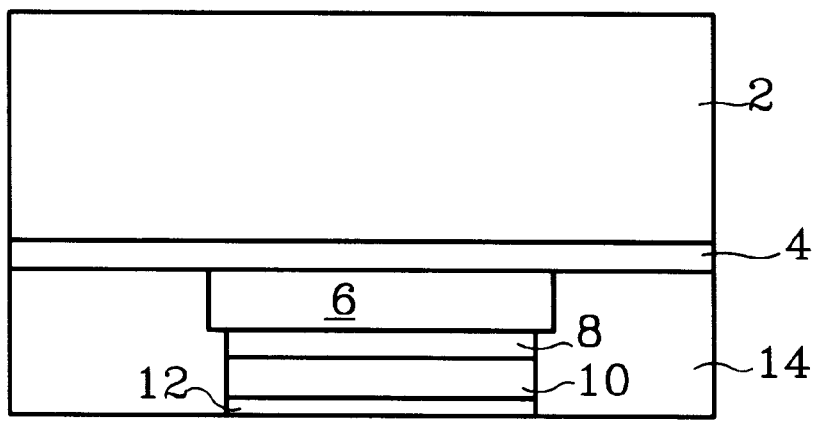

A layer 8 of $Bi_xTiO_y$ is deposited on the exposed areas of hastalloy layer 4 as well as on the surfaces of the YSZ mesa 6, using a solgel process, as shown in FIG. 2. On $Bi_xTiO_y$ layer 8, a CMR (colossal magneto-resistance) film 10 is deposited on all surfaces with a solgel process and the best thermal processing available. A $Si_3N_4$ layer 12 is deposited on CMR film 10, thereby passivating the film.

A photoresist is applied to the surface of $Si_3N_4$ layer 12, and patterned to form a mesa of layers $Bi_xTiO_y$ 8, CMR 10, and $Si_3N_4$ 12 on YSZ 6 mesa. A subsequent etch of these three layers on the YSZ and hastalloy layers 6 and 4. Polyimide 14 is deposited to a depth greater than the height of the entire mesa and is planarized to the level of the mesa, with the resulting structure in FIG. 3.

Figure 4:
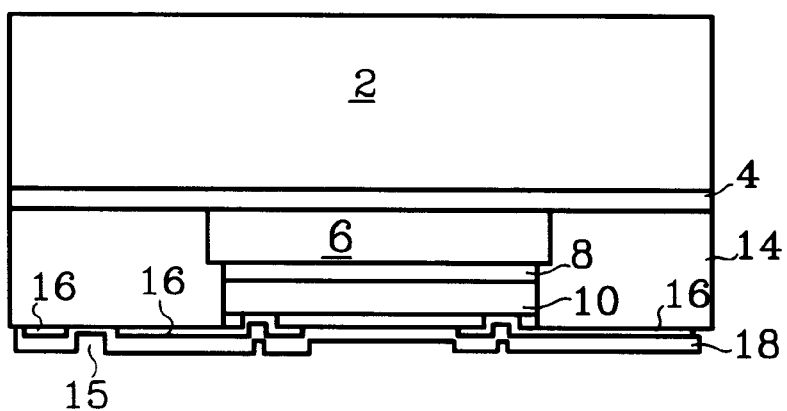

$Si_3N_4$ layer 12 is patterned in the same way, using a mask defining contacts to CMR film 10, as shown in FIG. 4. Metal 16 is deposited and patterned such that polyimide layer 14 is exposed in region 15 in the areas where layers 6, 8, 10, and 12 were previously removed. The width of the cut in metal 16 should be enough to allow deposition of a contact structure later in the process. A dielectric 18 providing passivation of the metal 16 is deposited.

Figure 5:
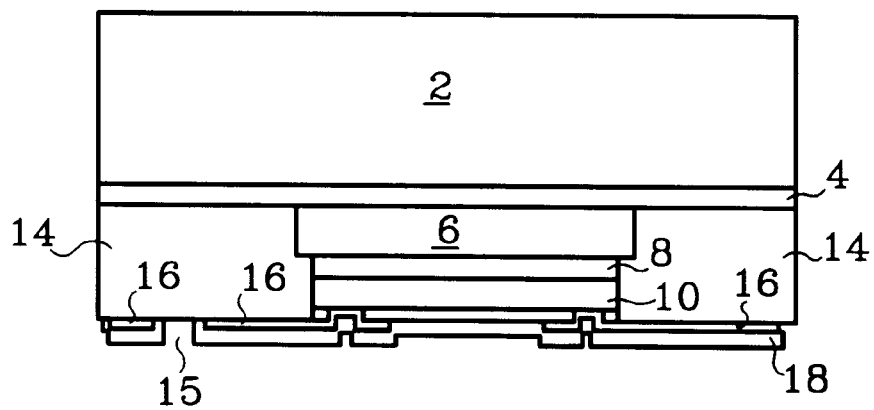
Figure 6:
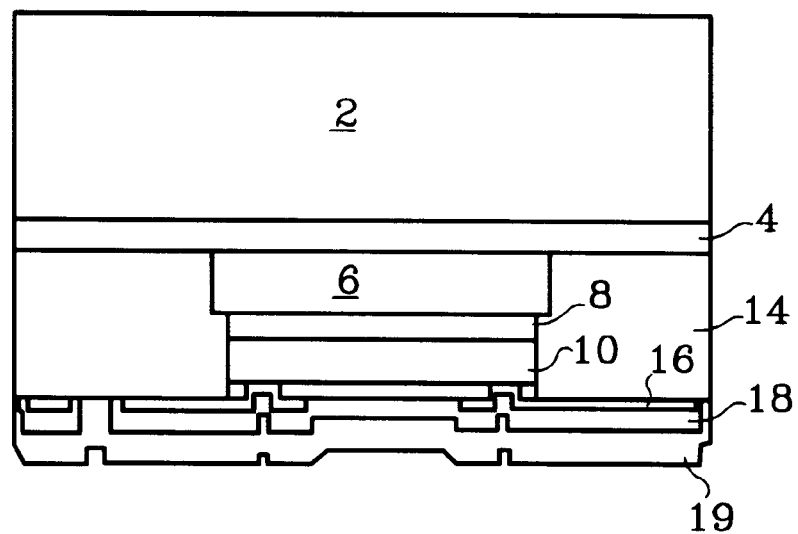

Dielectric 18 is patterned and removed in the region of space 15, providing direct access to polyimide layer 14 from the surface of the microstructure. FIG. 5 shows this structure.

Finally, a polyimide layer 19 is deposited across the surface to a depth of about 1000 angstroms, extending to the previously deposited polyimide layer 14 and to a height greater than the depth of space 15. This wafer and its microstructures now undergo thermal processing to about 100 degrees C. in order to partially cure polyimide layer 14. See FIG. 6. At this point, the fabrication of the sensor itself is complete.

In the second phase, the readout or drive electronics are formed on a wafer 22 using standard CMOS processes. An electronic connection is formed at the top level of the CMOS devices in order to make electrical contact with a microstructure that is formed in phase one. The present wafer carries a thick layer of sacrificial bonding material which when removed, with the thin polyimide layer on the other wafer, provides a cavity for thermal isolation of the CMOS devices from the microstructure and for optical reflection. These process steps are shown in FIGS. 7–10.

Figure 7:
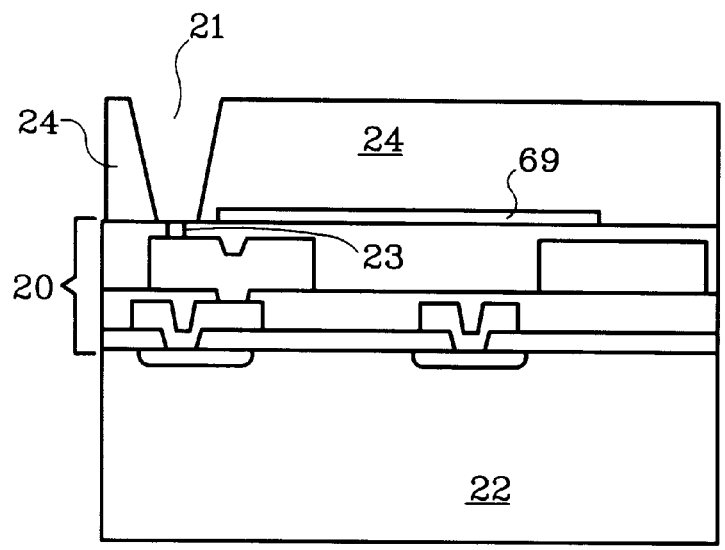
FIGS. 7–10 are cross-sectional views of an adaptive structure being formed over CMOS electronics on a silicon wafer.

CMOS devices 20 are formed on a first silicon wafer 22, being depicted in FIG. 7. A reflector 69 is deposited and patterned on top of the CMOS devices 20 to define the optical cavity between the reflector and the microstructure above it. A thick layer of polyimide 24 is deposited and patterned, producing a basket 21 above a CMOS lead 23 for the purpose of providing a form for metal to be deposited. Polyimide layer 24 also acts as a sacrificial layer, occupying a space between electronics 20 and the microstructure.

Figure 8:
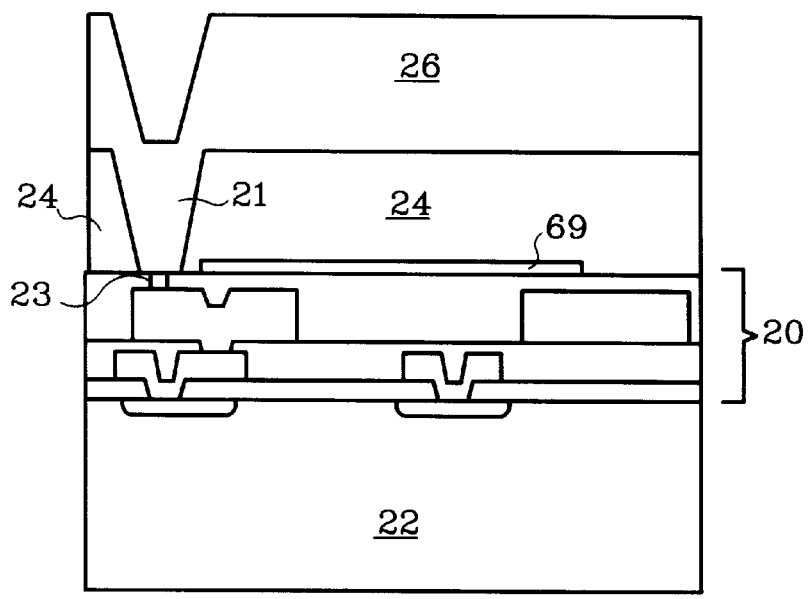

Aluminum 26 is deposited across the entire surface of polyimide layer 24, as seen in FIG. 8, making electrical contact with lead 23 at the bottom of basket 21, and thus to electronics 20, and filling basket 21 to a level above the level of polyimide layer 24.

Figure 9:
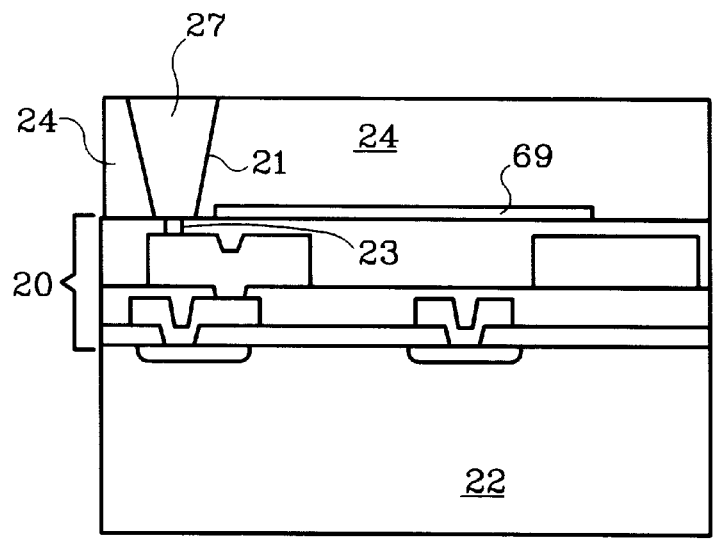

Aluminum post 27 is planarized in FIG. 9 by means of a chemical mechanical polish (CMP). This CMP is of a duration so as to re-expose polyimide 24 but not thin it a significant amount.

Figure 10:
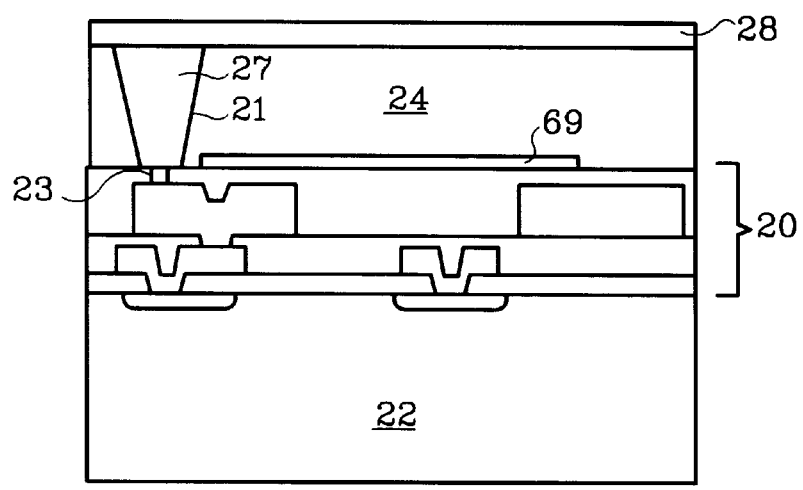

A polyimide layer 28 is deposited across the surfaces of planarized polyimide 24 and aluminum post 27, as shown in FIG. 10. This polyimide layer 28 is partially cured by baking at 100° C. for two minutes. The thickness of this layer is nominally about 1000 angstroms, but may need to be thicker in the presence of a non-planar surface. This temporarily completes processing on wafer 22.

The first half of the third and final phase is to attach the high temperature microstructure film to the CMOS devices by bonding polyimide layers 19 and 28, respectively, which are the top layers on each wafer. This is shown in FIG. 10. Next, wafer 2 is removed to allow exposure of the sensor.

Figure 11:
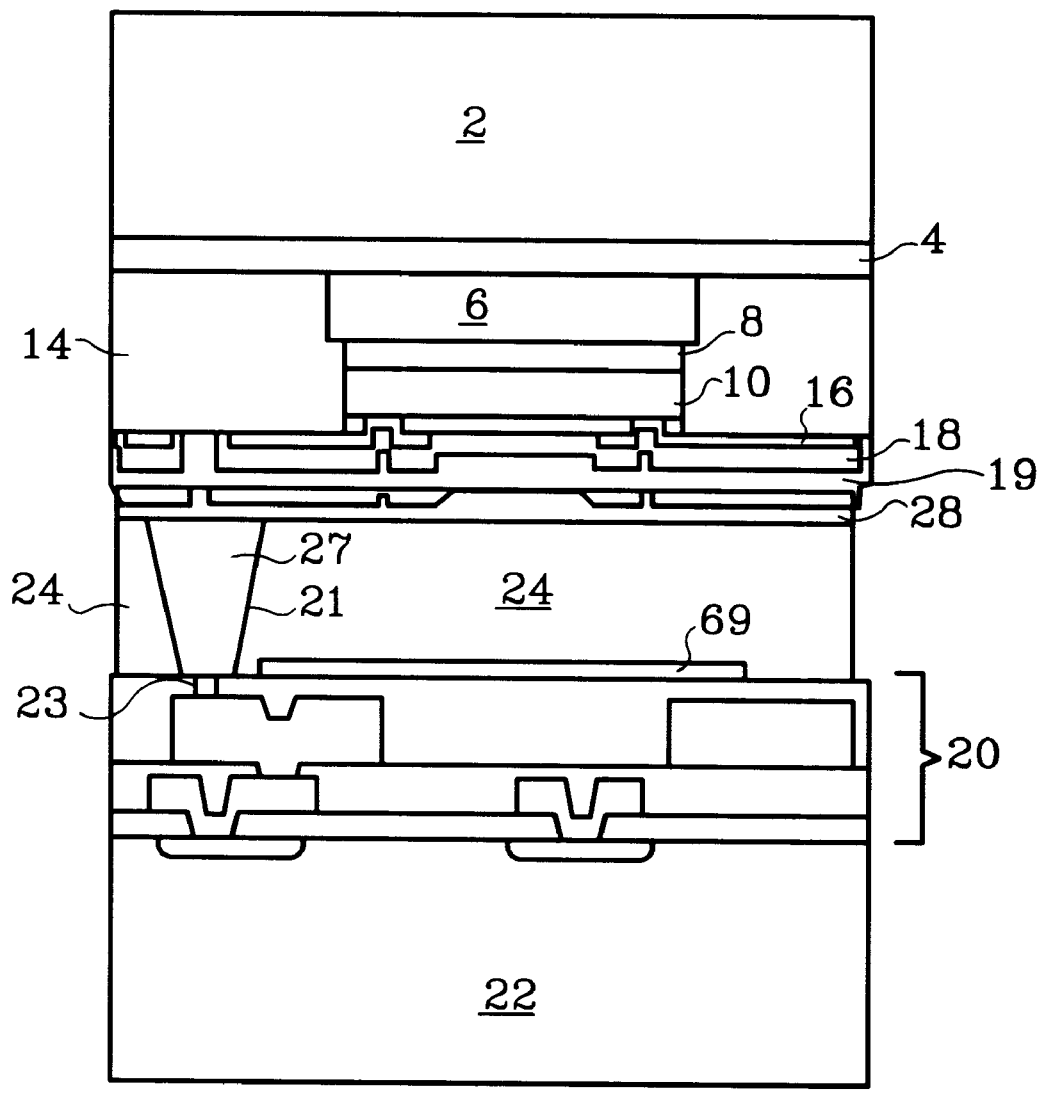
FIG. 11 shows the sensor and electronics after having been bonded together.

Being coated with soft-baked polyimide, the wafers are aligned to within one micron of their front surfaces opposite each other in a wafer-to-wafer bonding apparatus while being held a few microns (e.g., <100 microns) apart. They are fused together with the application of pressure and heat. Here is the essence of the present invention. This process discloses a simple method to bond these two structures. Also, it is a wafer level process that enables a quarter of a million devices to be fabricated in parallel. Pressures can range from 20 to 100 psi, 60 psi being nominal. Temperatures don't exceed 400 degrees C. Temperatures should not exceed 450 degrees C. when microelectronics are involved. The bonding process is done either in a vacuum or in the presence of non-oxidizing or inert gases. The resulting cross section is seen in FIG. 11.

Figure 12:
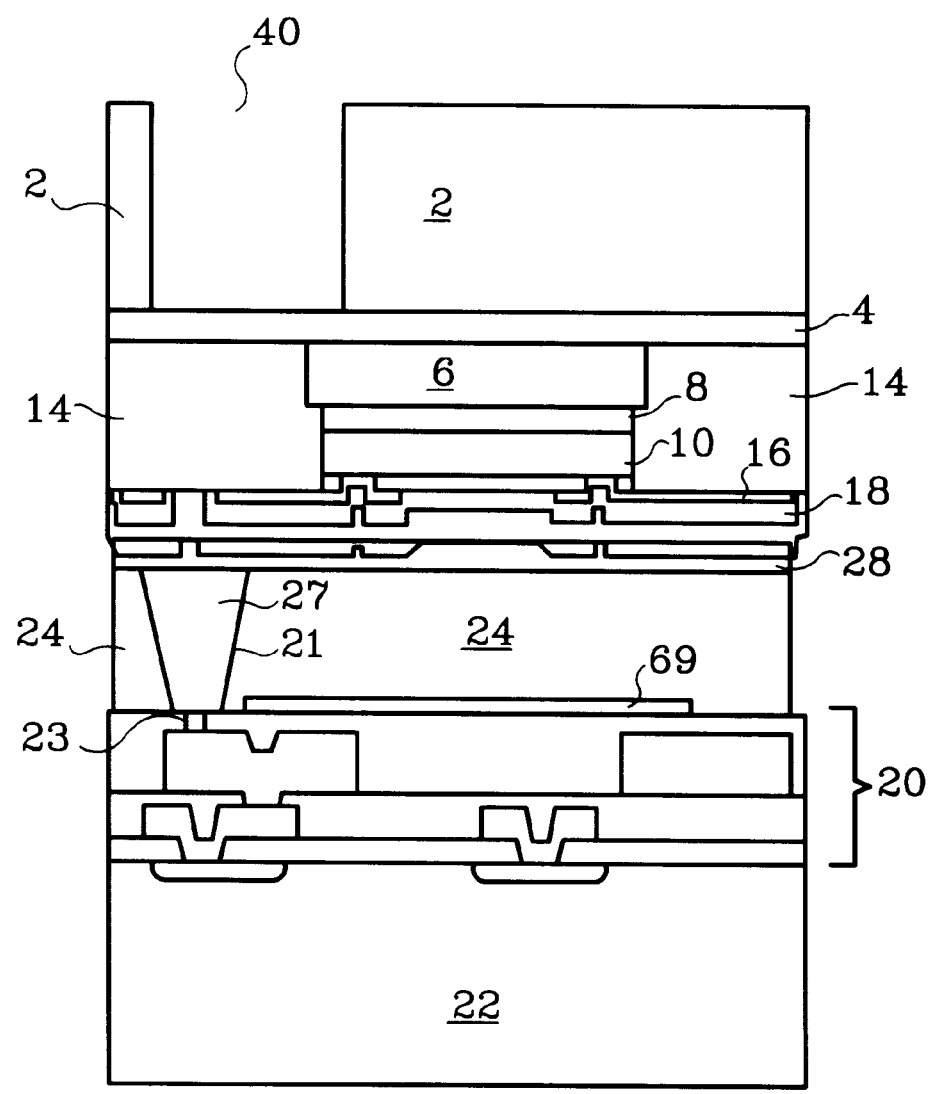
FIGS. 12–13 demonstrate a certain method of removing a silicon wafer, using a sacrificial layer, after the structures have been bonded.
Figure 13:
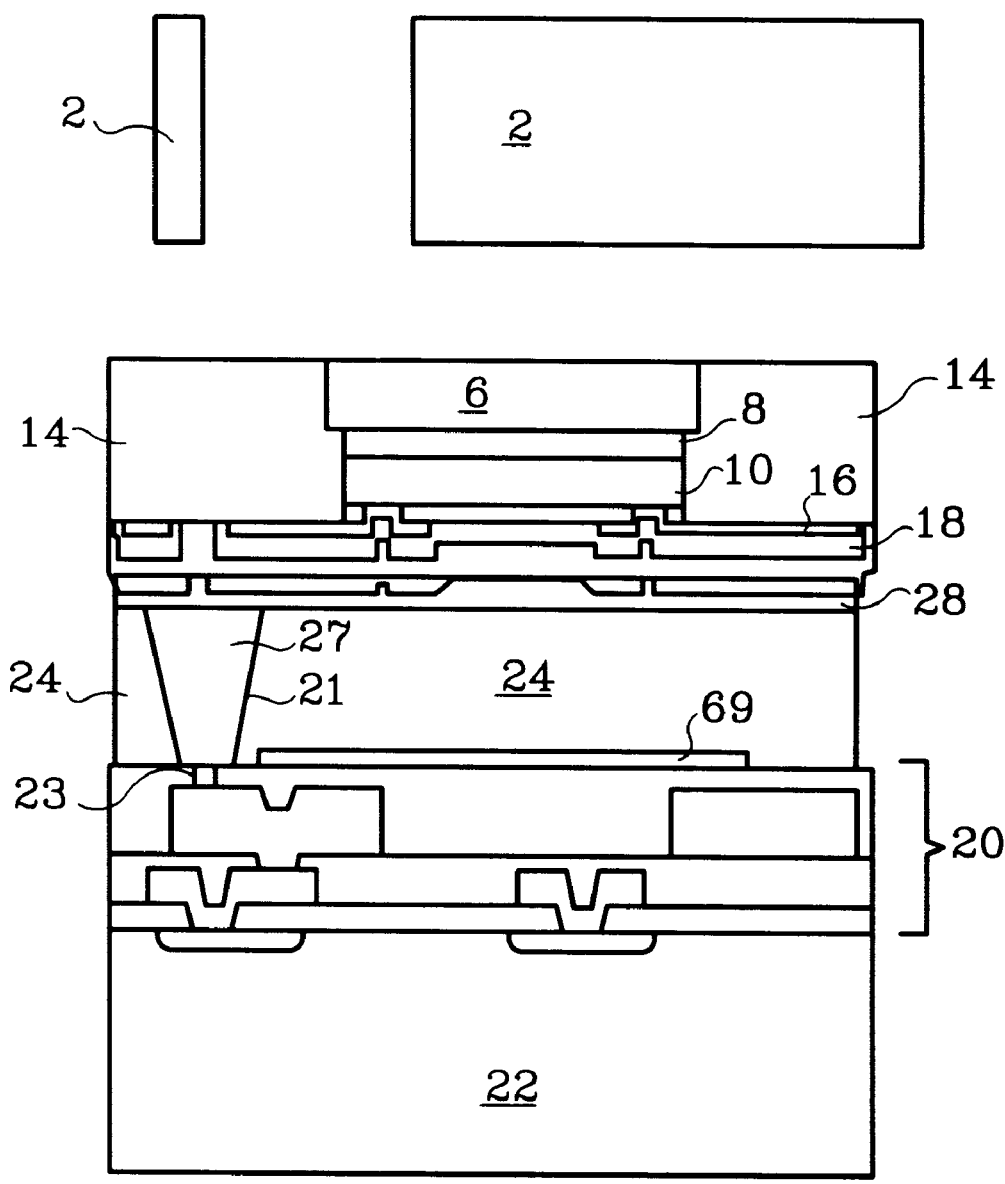

Access holes 40 are cut into temporary second wafer 2 from the back side using a deep RIE (reactive ion etch) silicon etch, stopping on hastalloy release layer 4, as seen in FIG. 12. These holes provide local exposure to hastalloy layer 4, thereby allowing the hastalloy to be etched in a shorter period of time. The release layer is chemically etched to allow the removal of temporary wafer 2 from the bonded assembly, being shown in FIG. 13.

Figure 14:
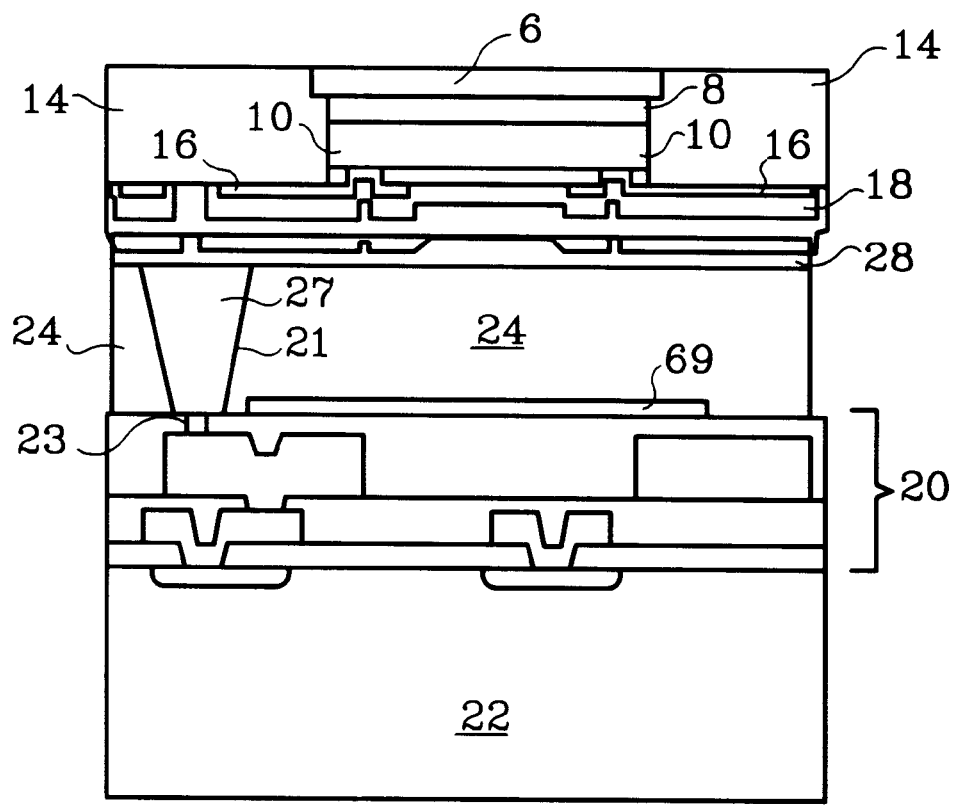
FIG. 14 demonstrates further processing on the structure formed on the removed wafer.

YSZ crystal orientation layer 6 and surrounding polyimide layer 14 are thinned by a means of blanket milling to a thickness as desired for the sensor. FIG. 14 illustrates this.

The second half of the third and final phase is to open a region between the microstructure and post 27 created on the readout wafer, make an electrical and physical connection, and remove sacrificial polyimide layers 19, 24 and 28, so as to provide thermal isolation between the microstructure and the readout substrate.

Figure 15:
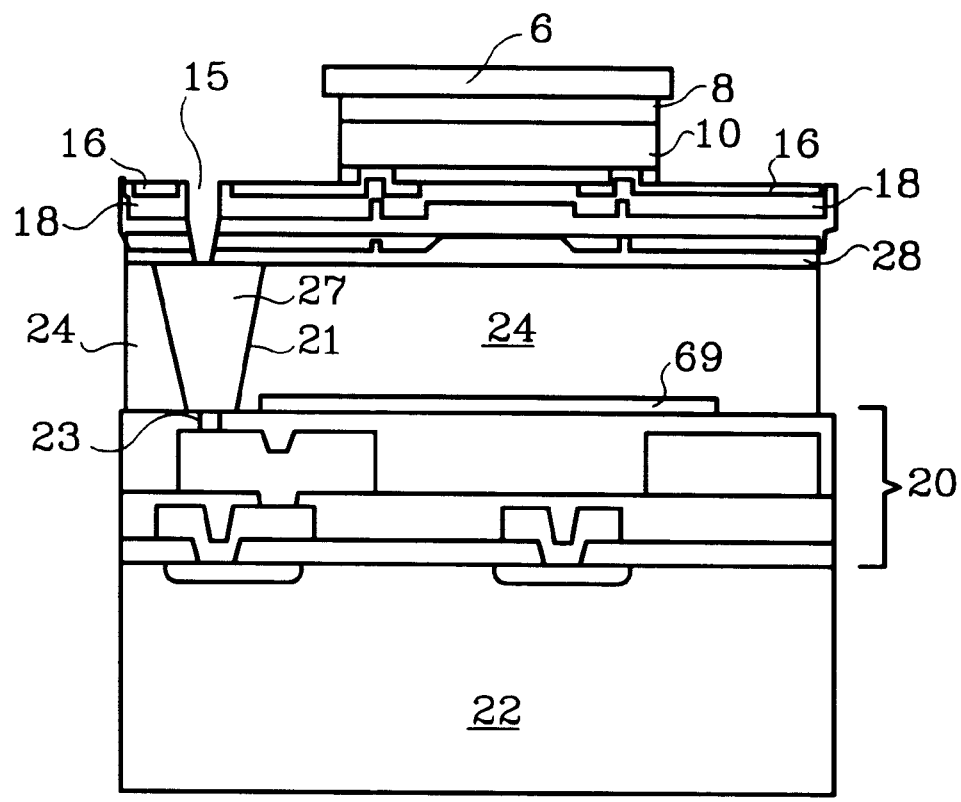
FIG. 15 shows the removal of part of the original bonding mediums.

FIG. 15 displays the bonded assembly after some of the polyimide 14, 19, 24 has been removed. The anisotropic etch removes a portion of polyimide 14 layer at the surface of the structure and is allowed to continue through space 15 in metal 16. The etchant stops at aluminum post 27 while removing portions of polyimide layers 19 and 28 that had been at the surface of the wafers at the time of bonding and below space 15.

Figure 16:
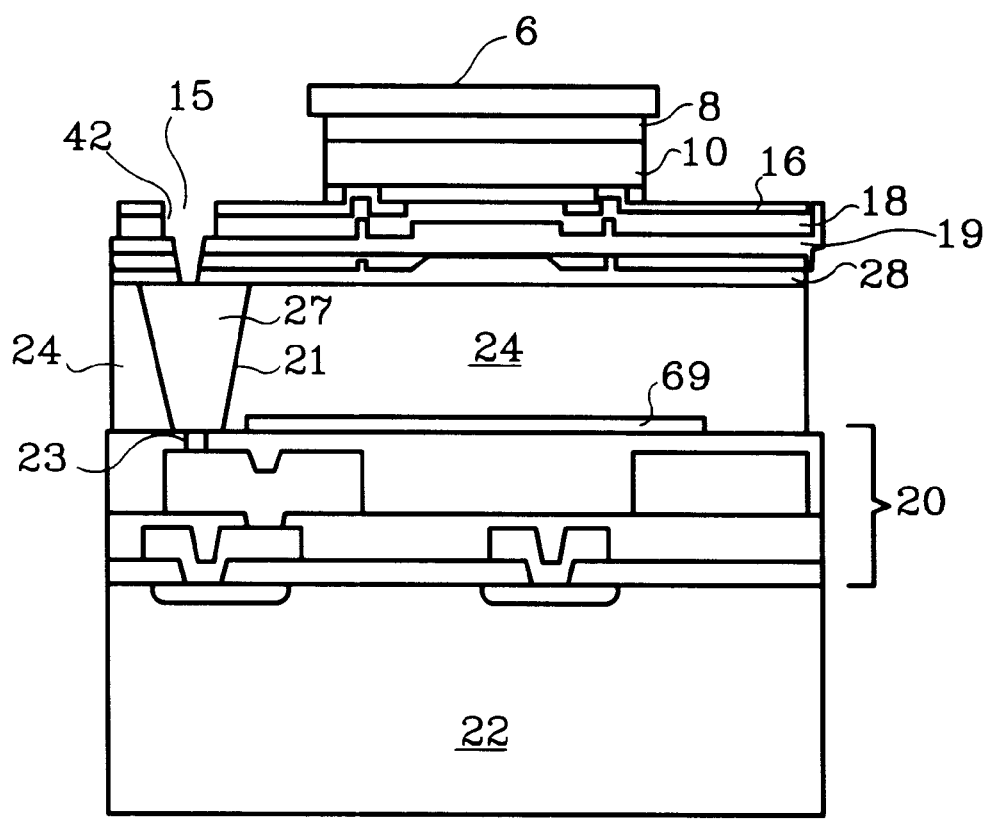
FIG. 16 shows the removal of dielectric material in a region into which a contact is to be deposited.

A cut, self-aligned to YSZ film 6 and leg metal 16, is made of dielectric layer 18 in region 42, as demonstrated in FIG. 16.

Figure 17:
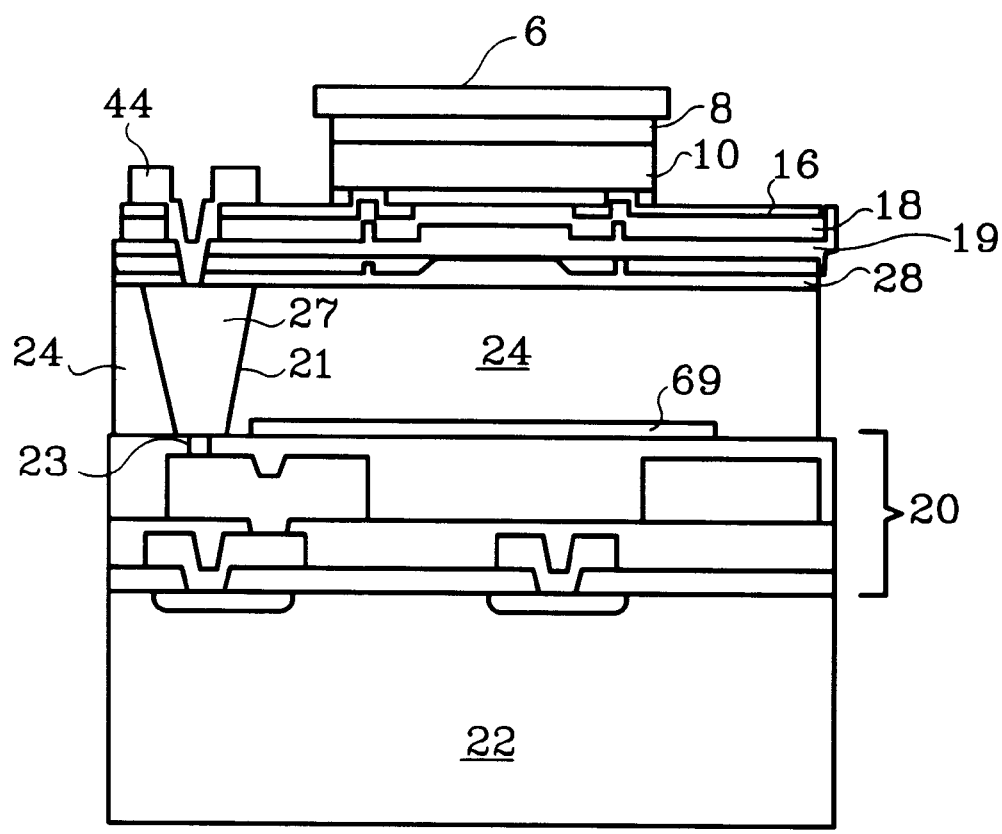
FIG. 17 shows the deposition of a structural and electrical contact on the final bonding medium.

The second-to-last stage of processing involves depositing and patterning an electrical and structural contact 44 in the discussed region 42, affixed to post 27 and leg metal 16. FIG. 17 shows the contact.

Figure 18:
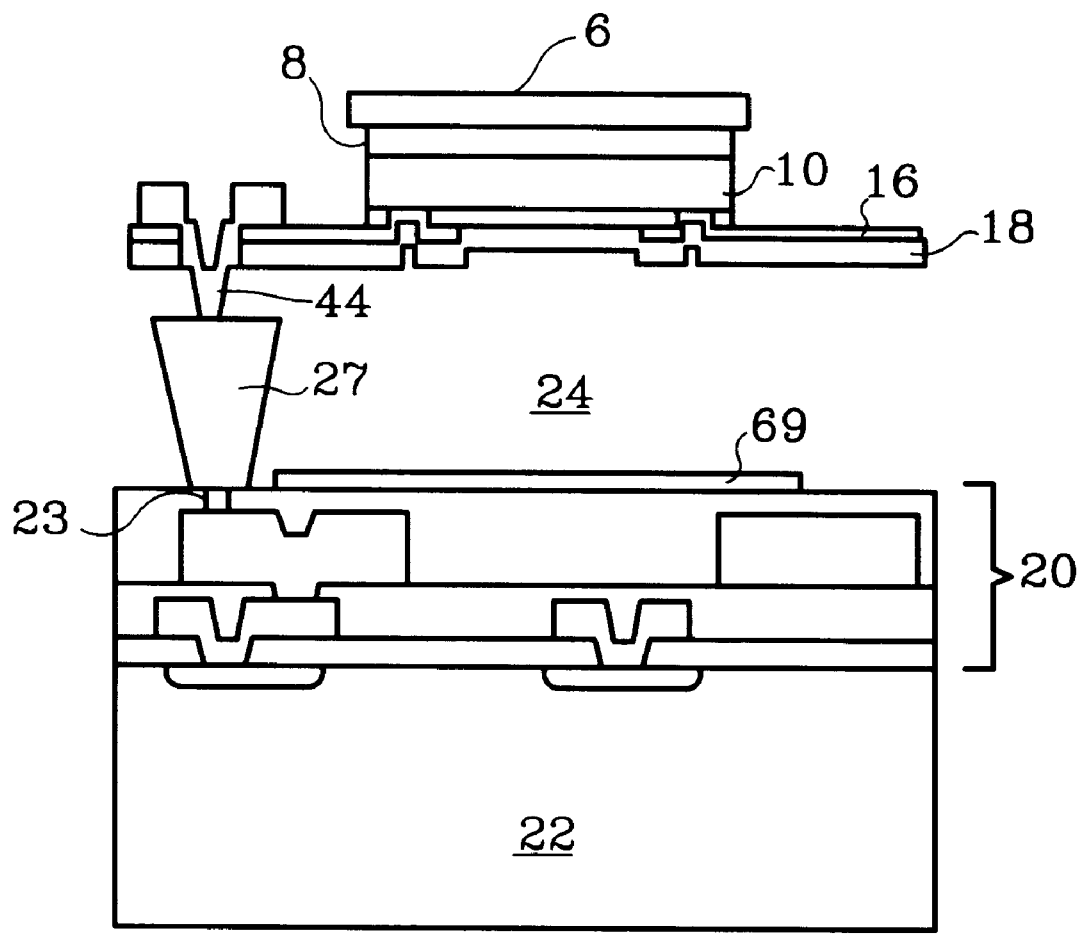
FIG. 18 shows the removal of other sacrificial material.

Finally, FIG. 18 shows the final product after a dry etch has removed the remaining parts of polyimide layers 24, 28, 19, creating the final desired thermal isolation.

Figure 19:
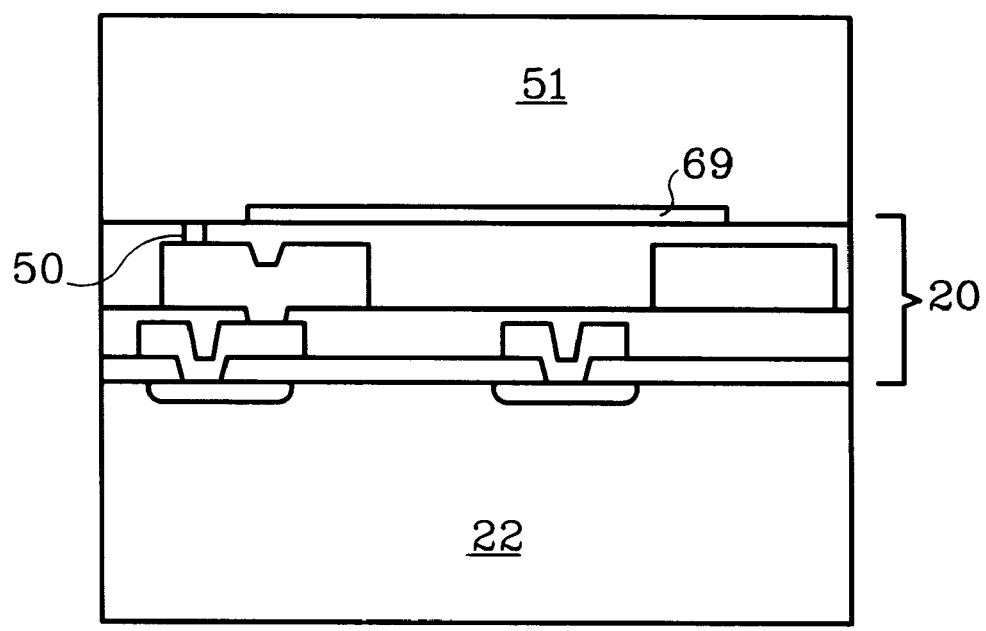
FIG. 19 shows the deposition of a reflector and a polyimide sacrificial layer on the wafer.

The above procedure can be modified to eliminate the use of post 27. The following illustrates that modification. In FIG. 19, as in FIG. 1, reflector 69 is deposited and patterned on top of CMOS electronics 20 and their interconnect metals 50 to form the optically resonant cavity between the reflector deposited and patterned on top of wafer 22 and the microstructure of wafer 2. A layer of polyimide 51 is deposited on top of the resulting structure, but here it is not patterned or etched.

Figure 20:
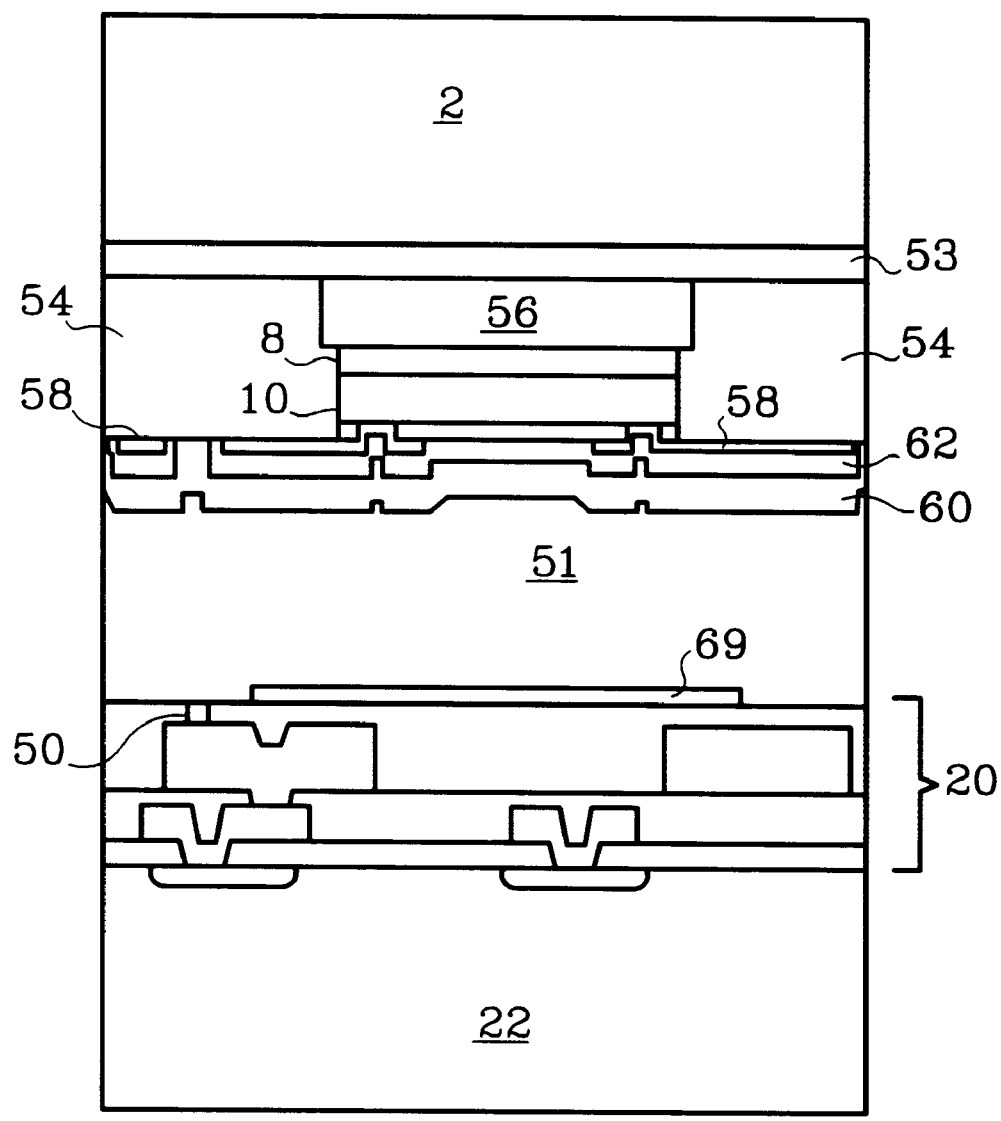
FIG. 20 shows an attachment of two wafers via their polyimide layers.
Figure 21:
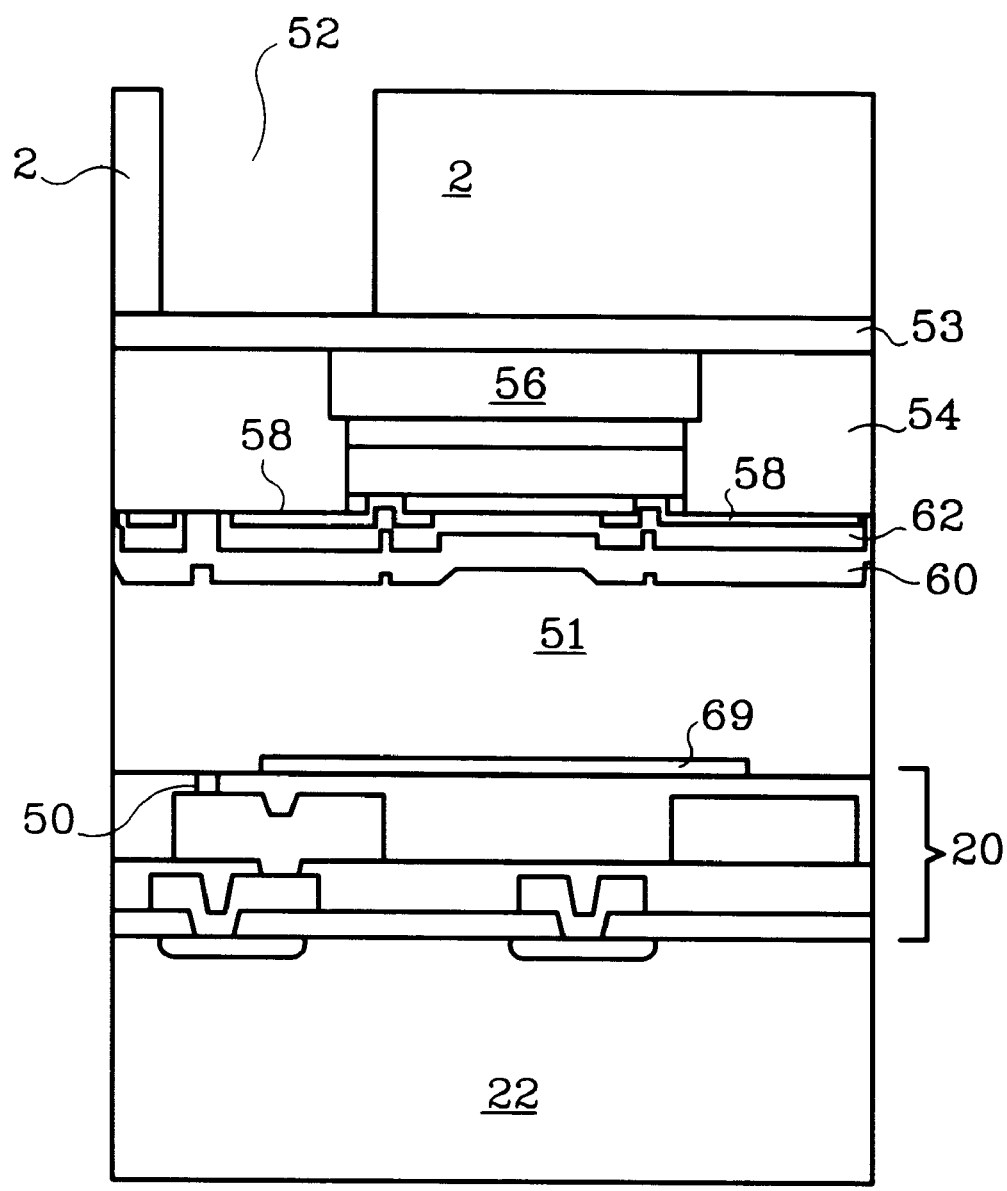
FIG. 21 shows the etch of an access hole through a silicon wafer to an etch stopping layer.
Figure 22:
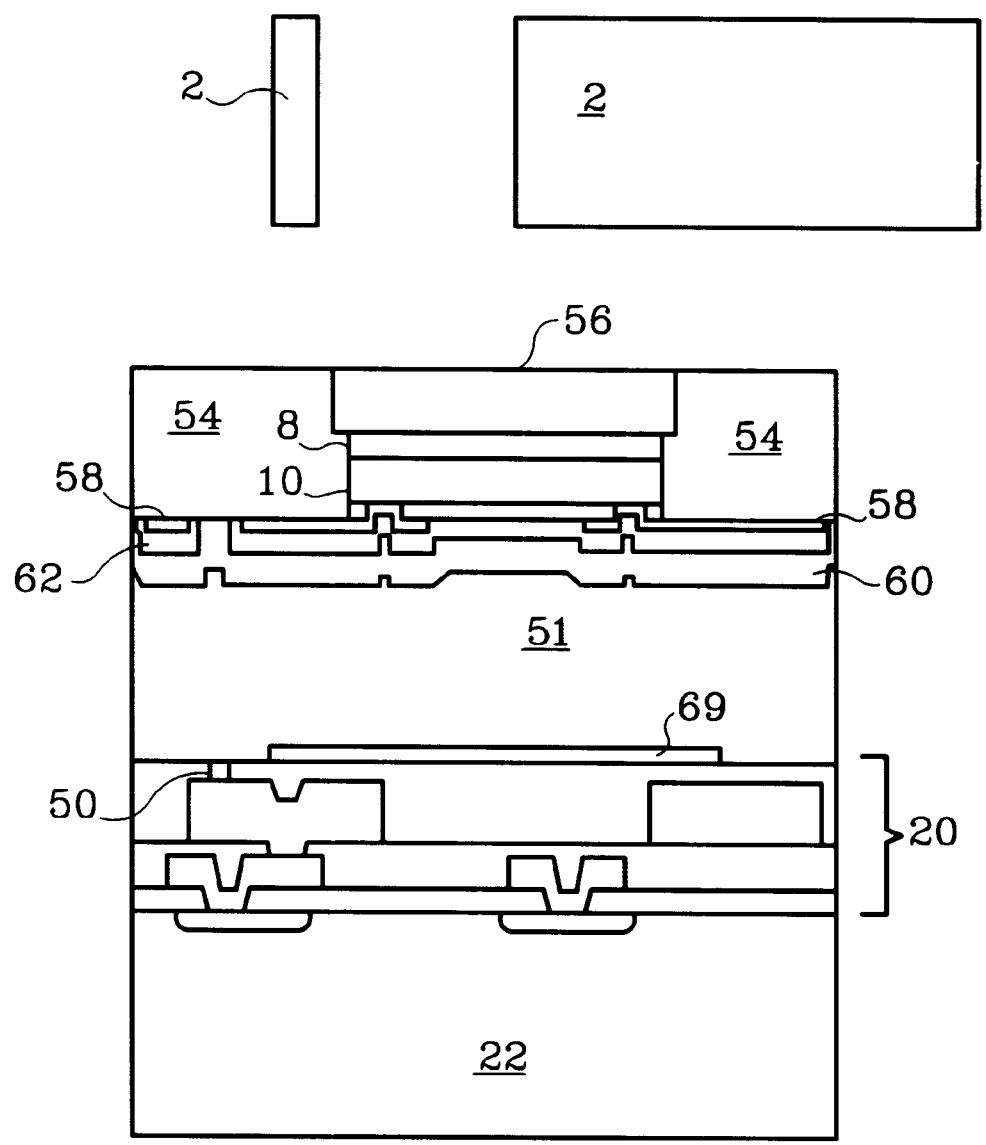
FIG. 22 shows the removal of the silicon wafer with the removal of the etch stopping layer of FIG. 21.
Figure 23:
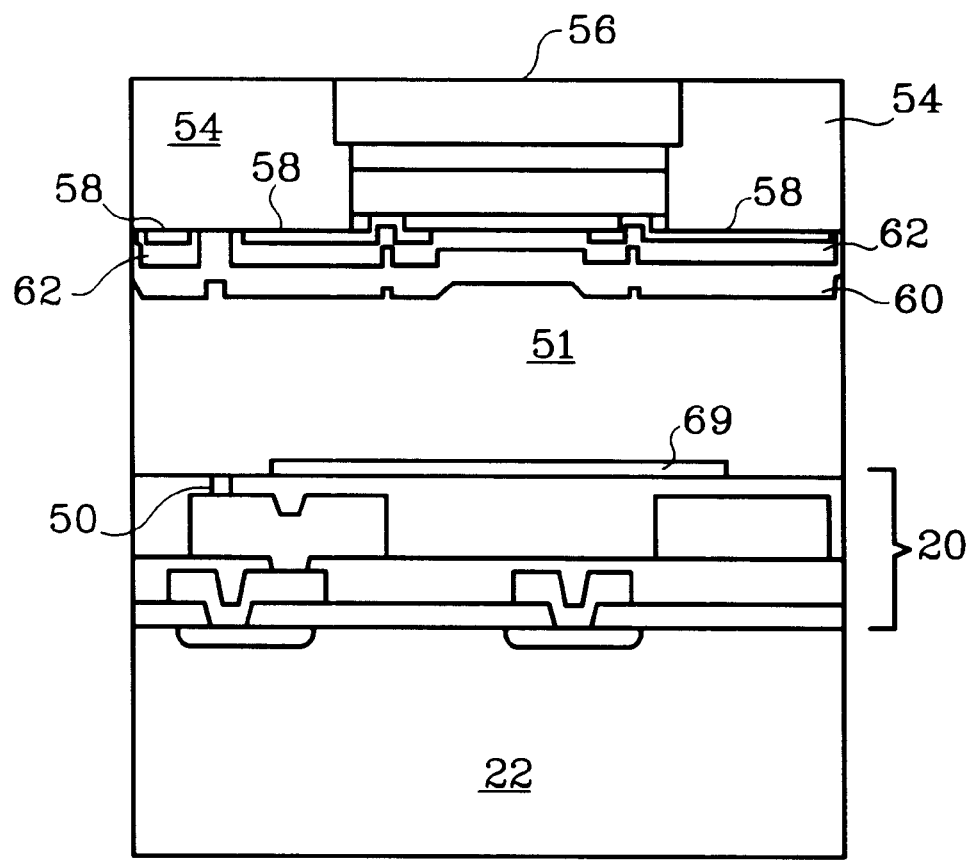
FIG. 23 reveals a YSZ crystal orientation layer and the polyimide layer thinned by milling.

As before, wafers 2, 22 of FIGS. 19 and 20, respectively, are bonded. Holes 52 are etched to hastalloy layer 53 through wafer 2, as shown in FIG. 21. Wafer 2 is removed with an etch of hastalloy layer 53 in FIG. 22. YSZ crystal orientation layer 56 is thinned by blanket milling along with polyimide layer 54 in FIG. 23.

Figure 24:
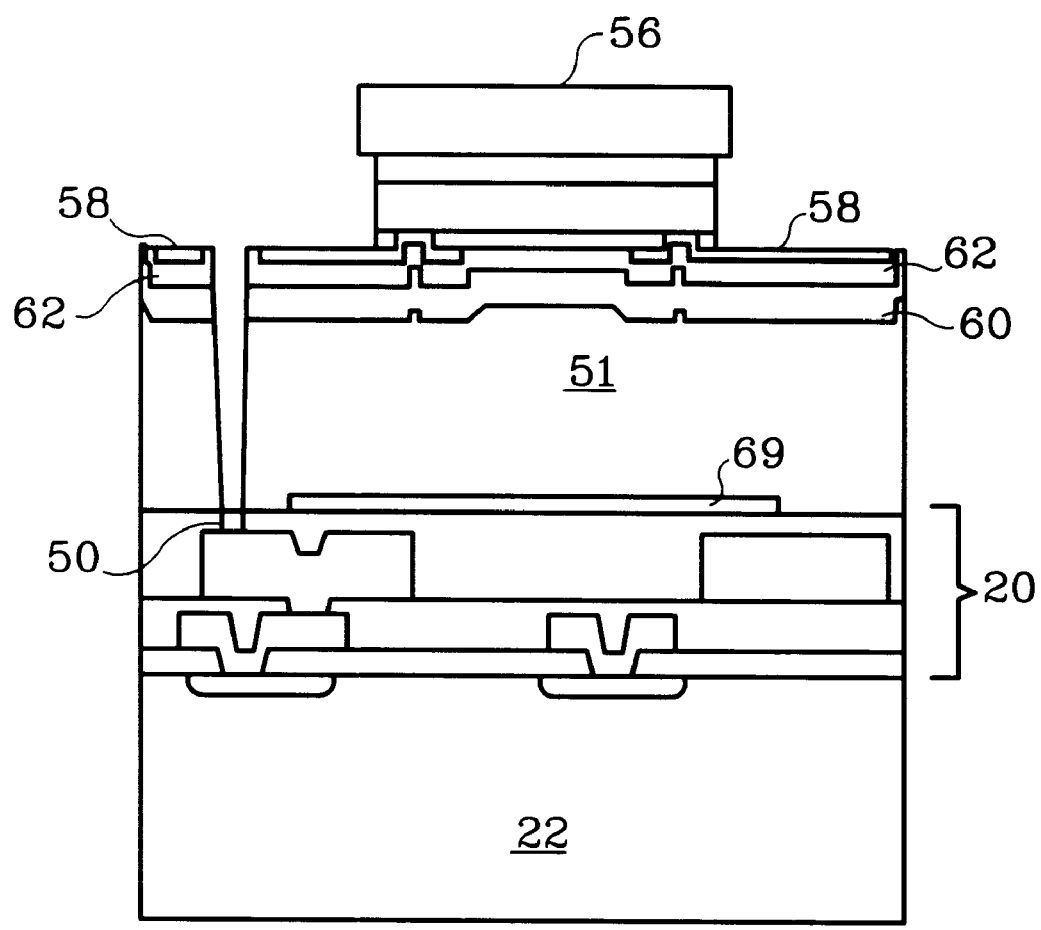
FIG. 24 shows the removal of the polyimide layer and a punch-through of another polyimide layer to contacts or reflectors of electronic devices.

In FIG. 24, as in FIG. 15, polyimide layer 54 and portions of layers 51 and 60 are etched, exposing leg metal 58 and punching through to CMOS lead 50, which is electrically connected to CMOS devices 20.

Figure 25:
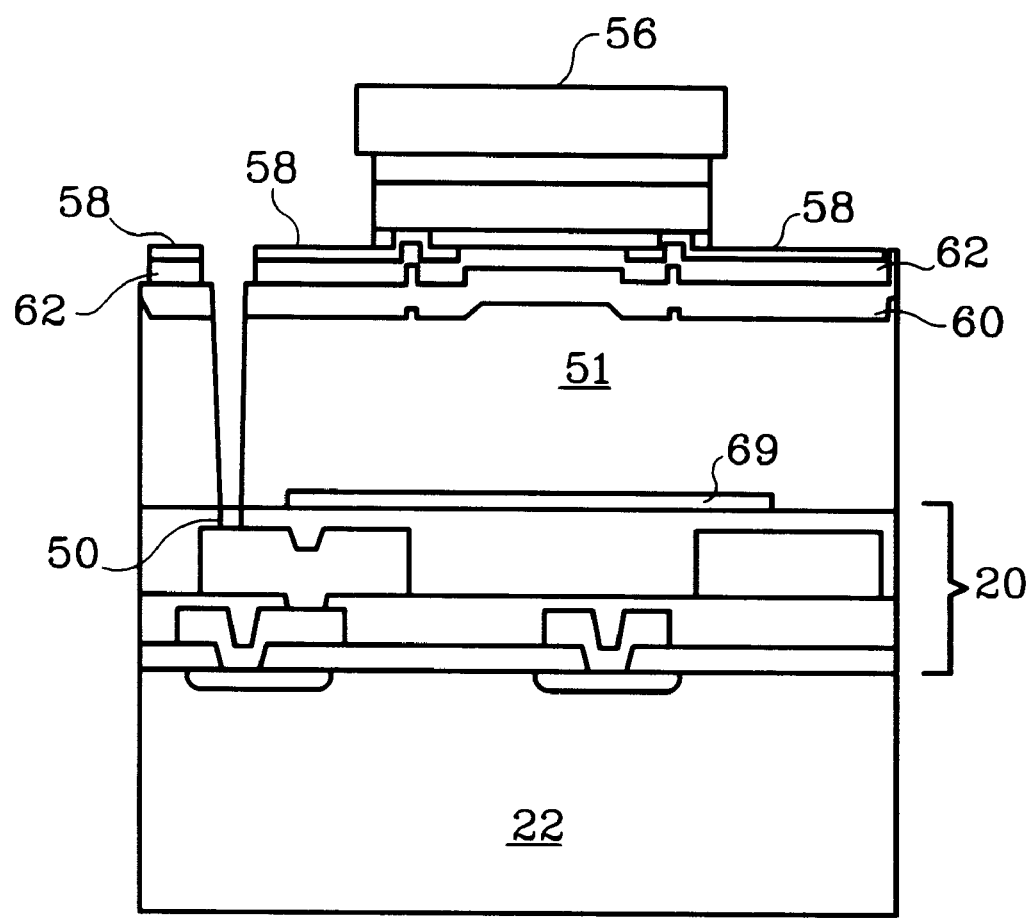
FIG. 25 reveals a self-aligned cut of dielectric layers.

A cut of dielectric layer 62, self-aligned to YSZ film 56 and leg metal features 58, is made and is shown in FIG. 25.

Figure 26:
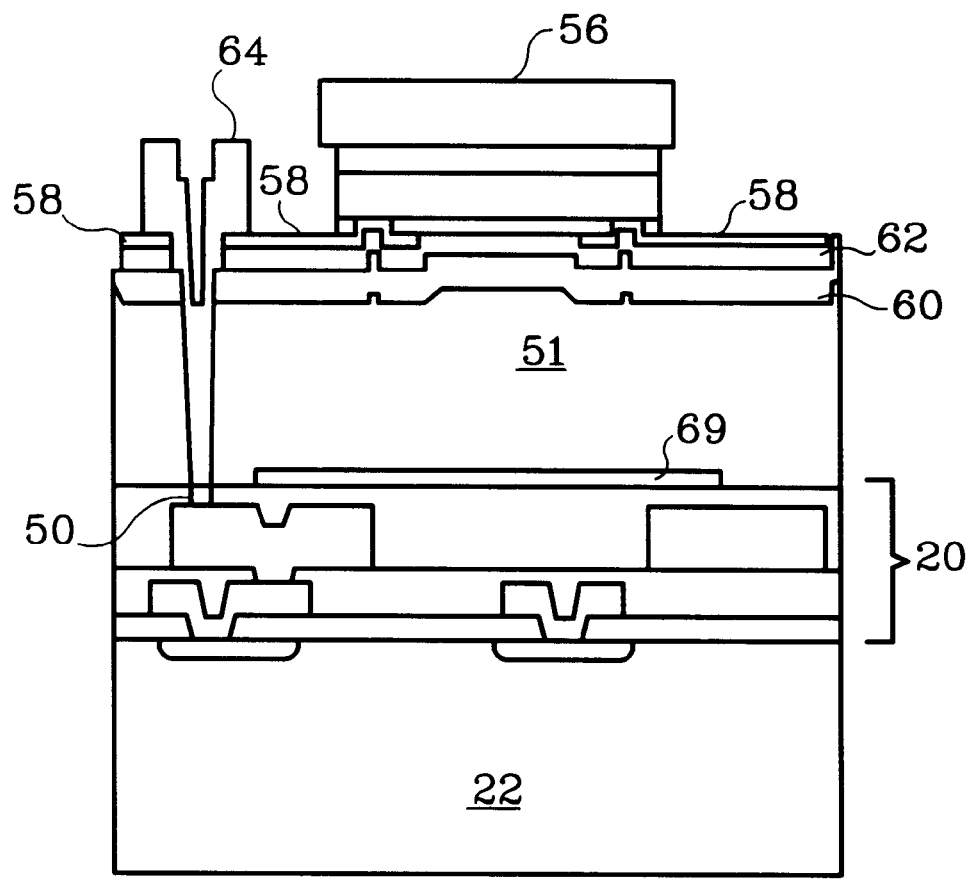
FIG. 26 shows a structural and electrical contact between a reflector or contact of the electronic devices and the leg metal.
Figure 27:
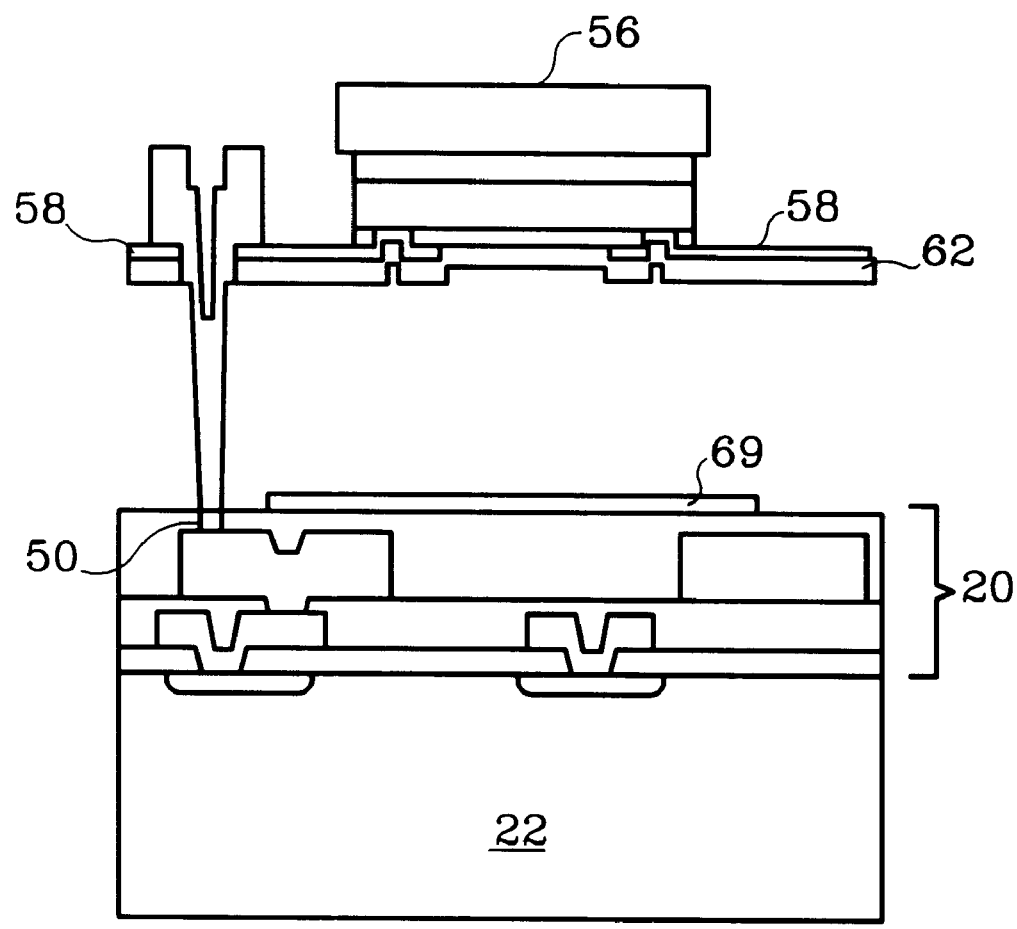
FIG. 27 reveals the removal of the sacrificial polyimide resulting in a thermal isolation between the leg metal and the device electronics.

Finally, contact 64 is deposited and patterned, making electrical and structural contact between CMOS lead metal 50 and leg metal 58, of FIG. 26. Remaining polyimide layers 51 and 60 are etched away, in FIG. 27. The resulting assembly uses only one deposited material to make the backside contact from leg metal 58 to CMOS lead metal 50.

The above procedure can be further modified to substitute the use of hastalloy with molybdenum for faster etching. Molybdenum requires less etching time for release but may not promote crystalinity in the YSZ and thereby the CMR films as well as hastalloy.

Figure 28:
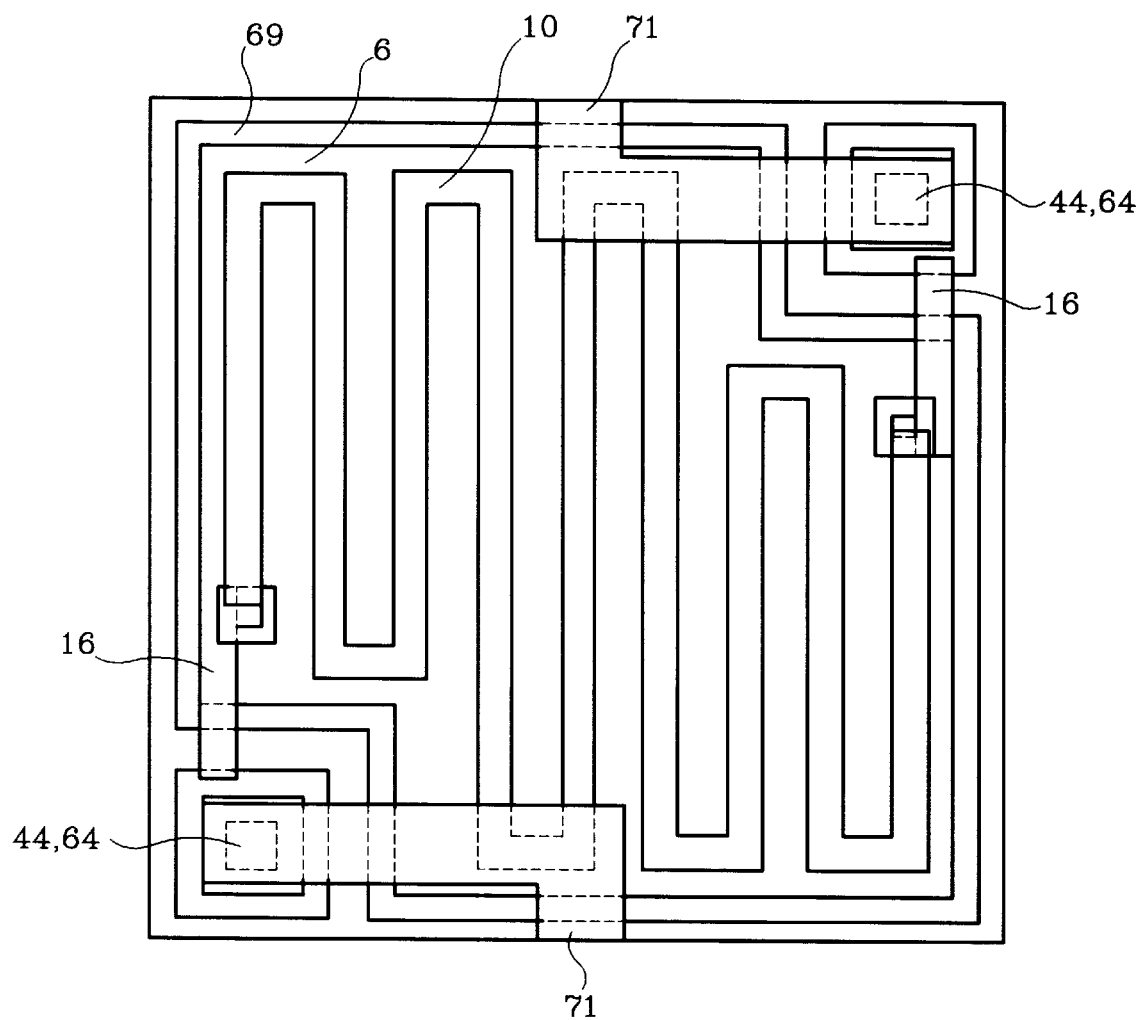
FIG. 28 is a planar view of a pixel use in the resultant device of the dual wafer attachment process.

FIG. 28 reveals a plan view of a pixel of the resultant device of the described process. It shows reflector 69, YSZ 6 and CMR resistor 10. Also, contacts 44 and 64, and leg metals 16. This figure shows interconnects 71, which are not shown in the cross-section view of the device, to pads.

This process allows the separation of the non-CMOS-compatible process steps, which in this case is the high temperature processing of the sensor material, from those needed to form CMOS electronics. It also demonstrates the assembly of these structures through thin film contact layers and sacrificial release layers. Although the process has been described using CMOS and non-CMOS processes, a much broader range of applications can be made.

Though the invention has been described with respect to a specific preferred embodiment, many variations and modifications will become apparent to those skilled in the art upon reading the present application. It is therefore intended that the appended claims be interpreted as broadly as possible in view of the prior art to include all such variations and modifications.

What is claimed is:

1. A process for attaching first and second wafers, at least one wafer having a microstructure, comprising:

making a first wafer having low-temperature microelectronics, having a first set of connections;

making a second wafer at a high temperature having a second set of connections mirrored to match the first set of connections;

applying a polyimide layer on a topside of said first wafer;

applying a polyimide layer on a topside of said second wafer;

soft baking said first and second wafers;

facing the topsides of said first and second wafers with each other;

aligning said first and second wafers to each other;

bonding said first and second wafers together under a pressure at a temperature in a non-oxidizing environment;

etching holes through said polyimide layers down to sets the respective of connections; and sputtering a conductive material into the holes so as to make contact to the sets of connections.

2. A process for a temperature sensitive wafer with a wafer processed at a high temperature, comprising:

forming a hastalloy layer on a first silicon wafer;

forming a YSZ film layer on the hastalloy layer;

patterning and etching the YSZ layer;

forming a $Bi_xTiO_y$ layer on the YSZ layer;

forming a CMR layer on the $Bi_xTiO_y$ layer;

forming a silicon nitride layer on the CMR layer;

patterning and etching the silicon nitrate, CMR and $Bi_x$-$TiO_y$ layers into a resister pattern;

forming a first polyimide layer on the silicon nitride layer and a portion of the hastalloy layer;

planarizing the first polyimide layer to the silicon nitride layer;

cutting a first via through the silicon nitride layer to the CMR layer;

forming a metal layer that fills the first via to contact the CMR layer;

patterning and etching the metal layer;

forming a dielectric layer on the metal layer;

etching a second via through the dielectric and metal layers to the first polyimide layer;

forming a second polyimide layer on the dielectric layer;

forming CMOS electronics on a second silicon wafer;

forming a third polyimide layer on the CMOS electronics;

patterning and etching a third via through the third polyimide layer to the CMOS electronics;

forming a metal layer that fills the third via to contact the CMOS electronics, on the third polyimide layer;

planarizing the metal layer to the third polyimide layer;

forming a fourth polyimide layer on portions of the third polyimide layer and the metal layer;

aligning first and second wafers, having the second and fourth polyimide layers proximate to each other;

press-bonding the second and fourth polyimide layers to each other;

cutting an access hole through the first silicon wafer to the hastalloy layer;

etching away the hastalloy layer to release the first silicon layer;

milling the first polyimide layer and the YSZ layer to thin the YSZ layer;

removing the first polyimide layer;

removing a portion of the second and fourth polyimide layers to provide a path via the second via to the metal layer situated in the third via;

forming a contact post in the second via to the metal layer situated in the third via; and remove the second, third and fourth polyimide layers; wherein the contact post and the metal layer situated in the third via provide structural support and thermal isolation between the YSZ, $Bi_xTiO_y$, CMR and silicon nitride layers and the CMOS electronics and second silicon wafer.

3. A process for attaching a temperature-sensitive wafer to high temperature wafer, comprising:

forming a hastalloy layer on a first wafer;

forming a YSZ layer on the hastalloy layer;

patterning and etching the YSZ layer;

forming a titanate layer on the YSZ layer;

forming a CMR layer on the $Bi_xTiO_y$ layer;

forming a first dielectric layer on the CMR layer;

patterning and etching the first dielectric, CMR and titanate layers into a resistor pattern;

forming a first polyimide layer on the first dielectric layer and a portion of the hastalloy layer;

planarizing the first polyimide layer to the first dielectric layer;

cutting a first via through the first dielectric layer to the CMR layer;

forming a metal layer that fills the first via to contact the CMR layer;

patterning and etching the metal layer forming a second dielectric layer on the metal layer;

etching a second via through the second dielectric and metal layers to the first polyimide layer;

forming a second polyimide layer on the dielectric layer;

forming CMOS on a second wafer;

forming a third polyimide layer on the CMOS;

aligning the first and second wafers and having the second and third polyimide layers proximate to each other;

press-bonding the second and third polyimide layers to each other;

cutting an access hole through the first wafer;

removing the hastalloy layer via the access hole to release the first wafer;

removing the first polyimide layer;

punching a hole through the second via and second and third polyimide layers to the CMOS;

forming a contact post through the metal layer, dielectric layer, and second and third polyimide layers via the hole; and removing the second and third polyimide layers to result in thermal isolation between the CMOS and the metal layers.

4. A process for attaching first and second wafers comprising:

forming a first microstructure on the first wafer;

forming a second microstructure on the second wafer;

coating the first microstructure with a first sacrificial bonding material having a first thickness;

coating the second microstructure with a second sacrificial bonding material having a second thickness;

aligning the first and second wafers;

bringing the first and second sacrificial bonding materials into contact; and fusing the coatings and forming a bond between the first and second sacrificial bonding materials and between the first and second microstructures such that the first and second thicknesses of the first and second sacrificial bonding materials, respectively, determine a separation between the first and second microstructures.

5. The process of claim 4, wherein the first wafer is silicon.

6. The process of claim 5, wherein the second wafer is made of silicon.

7. The process of claim 6, wherein the first microstructure formed on the first wafer is microelectronics.

8. The process of claim 7, wherein the first and second sacrificial bonding materials are polyimide.

9. The process of claim 8, wherein the first and second thicknesses of the first and second sacrificial bonding materials, respectively, are approximately equal.

10. The process of claim 9, wherein the fusing the coatings is followed by removing the sacrificial bonding materials.

11. The process of claim 1, wherein the fusing the coatings is followed by removing the second wafer.

12. The process of claim 11, wherein the removing the second wafer comprises removing a sacrificial layer to separate the second wafer from the second microstructure.

13. The process of claim 12, wherein the removing a sacrificial layer is preceded by a forming of an access to the sacrificial layer.

14. The process of claim 13 further comprising forming a contact from the first microstructure to the second microstructure.

15. The process of claim 14, wherein the contact is formed from a backside of one of the first or second microstructures.

16. The process of claim 15, further comprising fusing additional wafers, having microstructures and coated with bonding material, to the existing bonded microstructures.

17. A process for attaching first and second silicon wafers comprising:

forming microelectronics on the first silicon wafer;

forming a microstructure on the second silicon wafer;

coating the microelectronics with a first sacrificial polyimide bonding material having a first thickness;

coating the microstructure with a second sacrificial polyimide bonding material having a second thickness;

aligning the first and second silicon wafers;

bringing the first and second sacrificial polyimide bonding materials into contact; and fusing the coatings and forming a bond between the first and second sacrificial polyimide bonding materials and between the microelectronics and the microstructure such that the first and second thicknesses of the first and second sacrificial polyimide bonding materials, respectively, determine a separation between the microelectronics and the microstructure.

* * * * *